US010771234B2

(12) United States Patent
Lopelli et al.

(10) Patent No.: US 10,771,234 B2
(45) Date of Patent: Sep. 8, 2020

(54) APPARATUS AND METHOD FOR AN ALL-DIGITAL PHASE LOCK LOOP

(71) Applicant: QUALCOMM Incorporated, San Diego, CA (US)

(72) Inventors: Emanuele Lopelli, Laguna Niguel, CA (US); Magnus Olov Wiklund, San Jose, CA (US); Charles Chang-I Wang, Irvine, CA (US); Salvatore Pennisi, Irvine, CA (US); Richard McConnell, Rancho Cucamonga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/146,355

(22) Filed: Sep. 28, 2018

(65) Prior Publication Data
US 2020/0106599 A1    Apr. 2, 2020

(51) Int. Cl.
H04L 7/06    (2006.01)
H04L 7/00    (2006.01)
H04W 56/00    (2009.01)

(52) U.S. Cl.
CPC .............. *H04L 7/06* (2013.01); *H04L 7/0091* (2013.01); *H04W 56/001* (2013.01)

(58) Field of Classification Search
CPC ....... H04L 7/06; H04L 7/0091; H04W 56/001
USPC ....................................................... 375/358
See application file for complete search history.

(56) References Cited

U.S. PATENT DOCUMENTS

| 7,183,860 | B2 | 2/2007 | Staszewski et al. |
| 7,518,461 | B1 | 4/2009 | McCune et al. |
| 2007/0188244 | A1* | 8/2007 | Waheed ............... H03L 7/099 331/16 |
| 2009/0108891 | A1 | 4/2009 | Sander et al. |
| 2009/0322439 | A1 | 12/2009 | Mayer et al. |
| 2012/0062289 | A1* | 3/2012 | Suzuki ................. H03L 7/18 327/156 |
| 2012/0100821 | A1 | 4/2012 | Dan et al. |
| 2017/0194973 | A1 | 7/2017 | Moehlmann |
| 2017/0346508 | A1 | 11/2017 | Li et al. |
| 2018/0006616 | A1 | 1/2018 | Avivi et al. |

OTHER PUBLICATIONS

Buckel T., et al., "Digitally Controlled Oscillator Gain Estimation for RF-DPLLs in 4G LTE Polar Transmitters", 2016 IEEE International Symposium on Circuits and Systems, IEEE, 2016, pp. 2130-2133.
International Search Report and Written Opinion—PCT/US2019/046639—ISA/EPO—dated Dec. 4, 2019.

* cited by examiner

*Primary Examiner* — Wednel Cadeau
(74) *Attorney, Agent, or Firm* — Arent Fox, LLP and Qualcomm

(57) ABSTRACT

In an aspect of the disclosure, a method, a computer-readable medium, and an apparatus are provided. The apparatus may receive an otw signal that is associated with low-path pass information and transmission data. The apparatus may apply a cost function and an update function to the otw signal prior to sending the otw signal to an oscillator. The apparatus may determine a correction factor for use in estimating a gain of the oscillator based at least in part on an output of the update function.

9 Claims, 10 Drawing Sheets

ABSTRACT # APPARATUS AND METHOD FOR AN ALL-DIGITAL PHASE LOCK LOOP

BACKGROUND

Field

This disclosure relates generally to signal modulation using an All-Digital Phase Locked Loop (ADPLL) in a wireless communication device.

Background

Wireless communications between a wireless station (STA) and an access point (AP) in a wireless communication network are generally at high data rates and require maintaining a high level of reliability and quality of service (QoS). A wireless station (STA) may also be called an access terminal (AT). The deployment of wireless local area networks (WLANs) in the home, the office, and various public facilities is commonplace today. Such networks typically employ a wireless AP that connects a number of wireless STAs in a specific locality (e.g., home, office, public facility, etc.) to another network, such as the Internet or the like. Such wireless devices include Internet of Things (IoT) devices that communicate wirelessly using protocols such as Bluetooth® Low Energy (BLE), BLE Long Range, Bluetooth® Basic Rate (BR), Bluetooth® Enhanced Data Rate (EDR), IEEE 802.15.4 Zigbee, Wireless Local Area Network (WLAN) (802.11a/b/g/n/ah/ac/ax), and the like. The present disclosure relates generally to an all-digital phase locked loops (ADPLL) in such wireless devices.

Various functional blocks within the wireless device may need to operate consistently over a number of different operating conditions in order to maintain a high level of link reliability between the transmitter and the receiver (e.g. STA and AP). One such functional block is the ADPLL. Low power consumption, low frequency deviation in local oscillator frequency during operation, and maintaining consistent operating parameters over a large temperature variation are among a number of parameters that are considered for an implementation and operation of an ADPLL in wireless devices. There is a need for further improvements in ADPLL technology in order to maintain consistent operating parameters of a wireless device.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may receive an oscillator tuning word (otw) signal that is associated with low-path pass information and transmission data. The apparatus may apply a cost function and an update function to the otw signal prior to sending the otw signal to an oscillator. The apparatus may determine a correction factor for use in estimating a gain of the oscillator based at least in part on an output of the update function.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

The present disclosure relates generally to an ADPLL to consistently operate with minimal modulation inaccuracy while allowing the wireless device to establish, continue and maintain a communication link with another wireless device.

These and other aspects of the disclosure are provided in the following description and related drawings directed to various examples provided for illustration purposes. Alternate aspects may be devised without departing from the scope of the disclosure. Additionally, well-known aspects of the disclosure may not be described in detail or may be omitted so as not to obscure more relevant details.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., Application Specific Integrated Circuits (ASICs)), by program instructions being executed by one or more processors, or by a combination of both. In addition, for each of the aspects described herein, the corresponding form of any such aspect may be implemented as, for example, "logic configured to" perform the described action.

Figure 1:
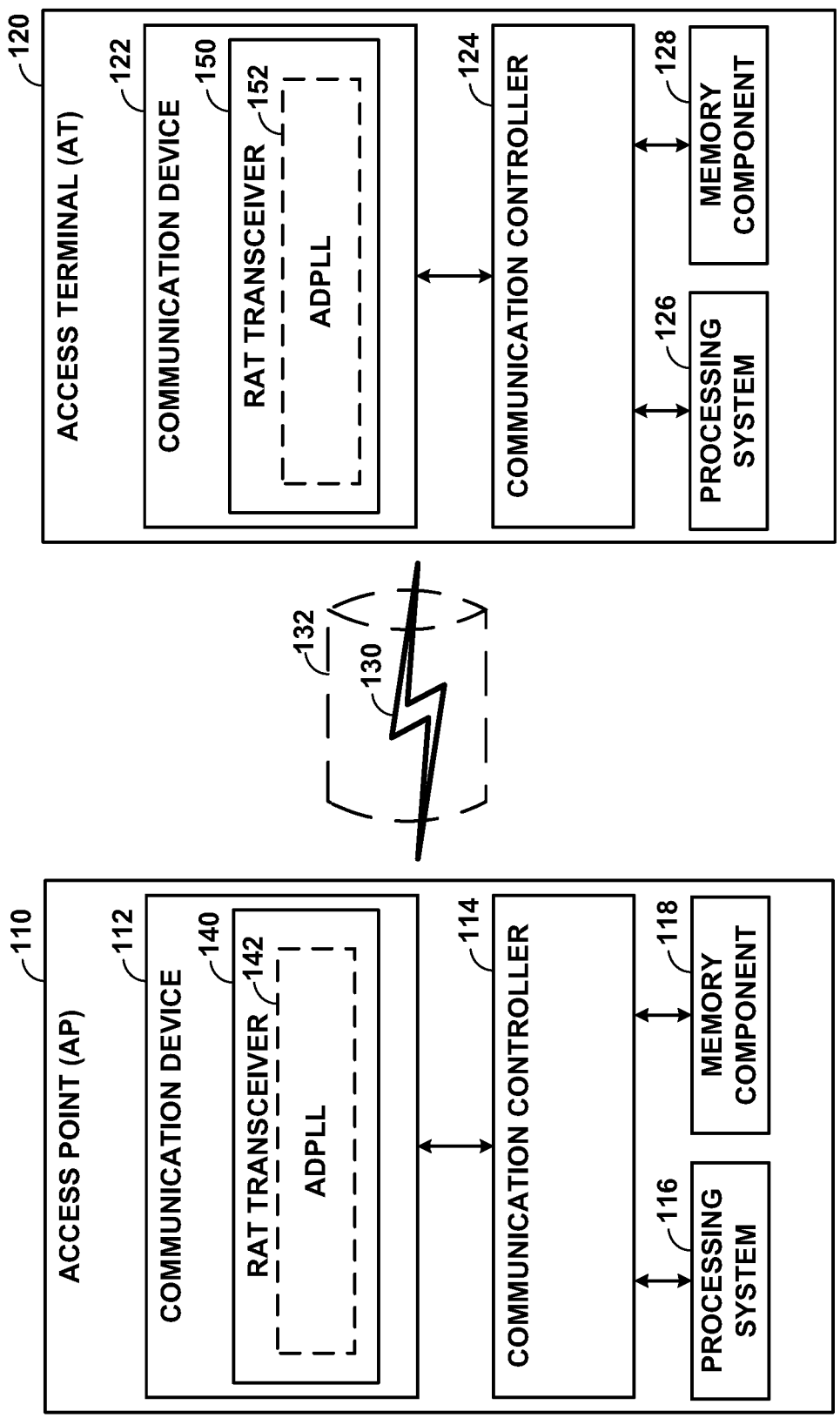
FIG. 1 illustrates an example wireless communication system including an Access Point (AP) in communication with an Access Terminal (AT).

FIG. 1 is a diagram that illustrates an example wireless Access Point (AP) 110 in communication with a wireless Access Terminal (AT) 120. Unless otherwise noted, the terms "access terminal", and "access point" are not intended to be specific or limited to any particular Radio Access Technology (RAT). In general, access terminals may be any wireless communication device allowing a user to communicate over a communications network (e.g., a mobile phone, router, personal computer, server, entertainment device, Internet of Things (IoT)/Internet of Everything (IoE) capable device, in-vehicle communication device, etc.), and may be alternatively referred to in different RAT environments as a User Device (UD), a Mobile Station (MS), a Subscriber Station (STA), a User Equipment (UE), etc. Similarly, an access point may operate according to one or several RATs in communicating with access terminals depending on the network in which the access point is deployed, and may be alternatively referred to as a Base Station (BS), a Network Node, a NodeB, an evolved NodeB (eNB), etc. Such an access point may correspond to a small cell access point, for example. "Small cells" generally refer to a class of low-powered access points that may include or be otherwise referred to as femto cells, pico cells, micro cells, Wi-Fi APs, other small coverage area APs, etc. Small cells may be deployed to supplement macro cell coverage, which may cover a few blocks within a neighborhood or several square miles in a rural environment, thereby leading to improved signaling, incremental capacity growth, richer user experience, and so on.

In the example of FIG. 1, the access point 110 and the access terminal 120 each generally include a wireless communication device (represented by communication devices 112 and 122) for communicating with other network nodes via at least one designated RAT. The communication devices 112 and 122 may be variously configured for transmitting and encoding signals (e.g., messages, indications, information, and so on), and, conversely, for receiving and decoding signals (e.g., messages, indications, information, pilots, and so on) in accordance with the designated RAT. The communication device 112 of the access point 110 includes an RAT transceiver 140 configured to operate in accordance with a given RAT (e.g., Bluetooth®, Bluetooth® Low Energy, Wi-Fi, etc.). Similarly, the communication device 122 of the access terminal 120 includes an RAT transceiver 150 configured to operate in accordance with the RAT. As used herein, a "transceiver" may include a transmitter circuit, a receiver circuit, or a combination thereof, but need not provide both transmit and receive functionalities in all designs. For example, a low functionality receiver circuit may be employed in some designs to reduce costs when providing full communication is not necessary. The RAT transceivers 140 and 150 may include an ADPLL 142 and an ADPLL 152, respectively, as will be described further herein.

The access point 110 and the access terminal 120 may also each generally include a communication controller (represented by communication controllers 114 and 124) for controlling operation of their respective communication devices 112 and 122 (e.g., directing, modifying, enabling, disabling, etc.). The communication controllers 114 and 124 may operate at the direction of, or otherwise in conjunction with, respective host system functionality (illustrated as processing systems 116 and 126 and memory components 118 and 128). In some designs, the communication controllers 114 and 124 may be partly or wholly subsumed by the respective host system functionality.

Turning to the illustrated communication in more detail, the access terminal 120 may transmit and receive messages via a wireless link 130 with the access point 110, the messages including information related to various types of communication (e.g., voice, data, multimedia services, associated control signaling, etc.). The wireless link 130 may operate over a communication medium of interest, shown by way of example in FIG. 1 as medium 132, which may be shared with other communications as well as other RATs. A medium of this type may be composed of one or more frequency, time, and/or space communication resources (e.g., encompassing one or more channels across one or more carriers) associated with communications between one or more transmitter/receiver pairs, such as the access point 110 and the access terminal 120 for the medium 132.

As a particular example, the medium 132 may correspond to at least a portion of an unlicensed frequency band shared with other RATs. In general, the access point 110 and the access terminal 120 may operate via the wireless link 130 according to one or more RATs depending on the network in which they are deployed. These networks may include, for example, different variants of Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, and so on. Although different licensed frequency bands have been reserved for such communications (e.g., by a government entity such as the Federal Communications Commission (FCC) in the United States), certain communication networks, in particular those employing small cell access points, have extended operation into unlicensed frequency bands such as the Unlicensed National Information Infrastructure (U-NII) band used by Wireless Local Area Network (WLAN) technologies, most notably IEEE 802.11ax WLAN technologies generally referred to as "Wi-Fi."

Employing an ADPLL, within a wireless device may lower the power consumption of a wireless device as compared to using analog phase-locked loops (APLLs). A phase-locked loop (PLL) may be considered a control system in an electronic circuit comprising a variable frequency oscillator for adjusting and maintaining the oscillator to output a signal at a specific frequency and consistent phase output. The ADPLL 142 and 152 are electronic circuits in which an oscillator may be coupled with the operation of a PLL. Moreover, for transmission of a wireless signal, the transmitted data may be appropriately modulated on a carrier signal whose frequency is controlled by an oscillator coupled with operation of a PLL. Therefore, ADPLL 142 and 152 also include circuitry for modulating the data onto the carrier signal at a specific carrier frequency. The ADPLL may also need to modulate the data over a wide frequency bandwidth in order to communicate to the destination at a high data rate. Maintaining the carrier frequency at the specific frequency while modulating the data onto the carrier signal is always a challenge in design and implementation of the ADPLL. One or more aspect of the present disclosure provides for an operation of the ADPLL such that any modulation error is minimized even at high data rates.

Phase-locked loops may be used in many applications, including use in local oscillators of wireless transceivers (i.e., receivers and/or transmitters). In certain applications, such phase-locked loops are implemented with analog circuitry. However, as the operating speeds of digital circuits increase, it is becoming more feasible to implement at least portions of a phase-locked loop for traditionally analog applications using digital building blocks. These phase-locked loops are often referred to as All-Digital Phase Locked Loops (ADPLLs).

In operation, an ADPLL may be configured to receive a frequency signal (e.g., FREQ) that is representative of a desired output frequency. When the ADPLL is locked, the phase and/or frequency of an output signal may be locked relative to the frequency signal.

In some applications, a modulator may be used with the ADPLL to produce an output signal with a variety of frequencies. The modulator may be used in some instances to enable finer tuning of the output frequency, or in the case of a wireless transceiver, enable the transceiver to perform frequency modulation and/or phase modulation of digital data.

Modulation of an ADPLL may use a calibrated high-pass path in order to have modulation rates higher than the PLL bandwidth, and a slower low-pass path of the ADPLL to provide accurate settling of the modulation. Calibration of the high path, however, may be time consuming, complicated, and error prone. For example, a transceiver used for wireless communication may generate numerous frequencies due to the large number of communication channels, where each operating frequency may require a separate calibration. Furthermore, certain conventional ADPLLs may drift out of calibration during operation due to temperature or other process-related conditional changes. Additional details of an example ADPLL are described below in connection with any of FIGS. 2-9.

Figure 2:
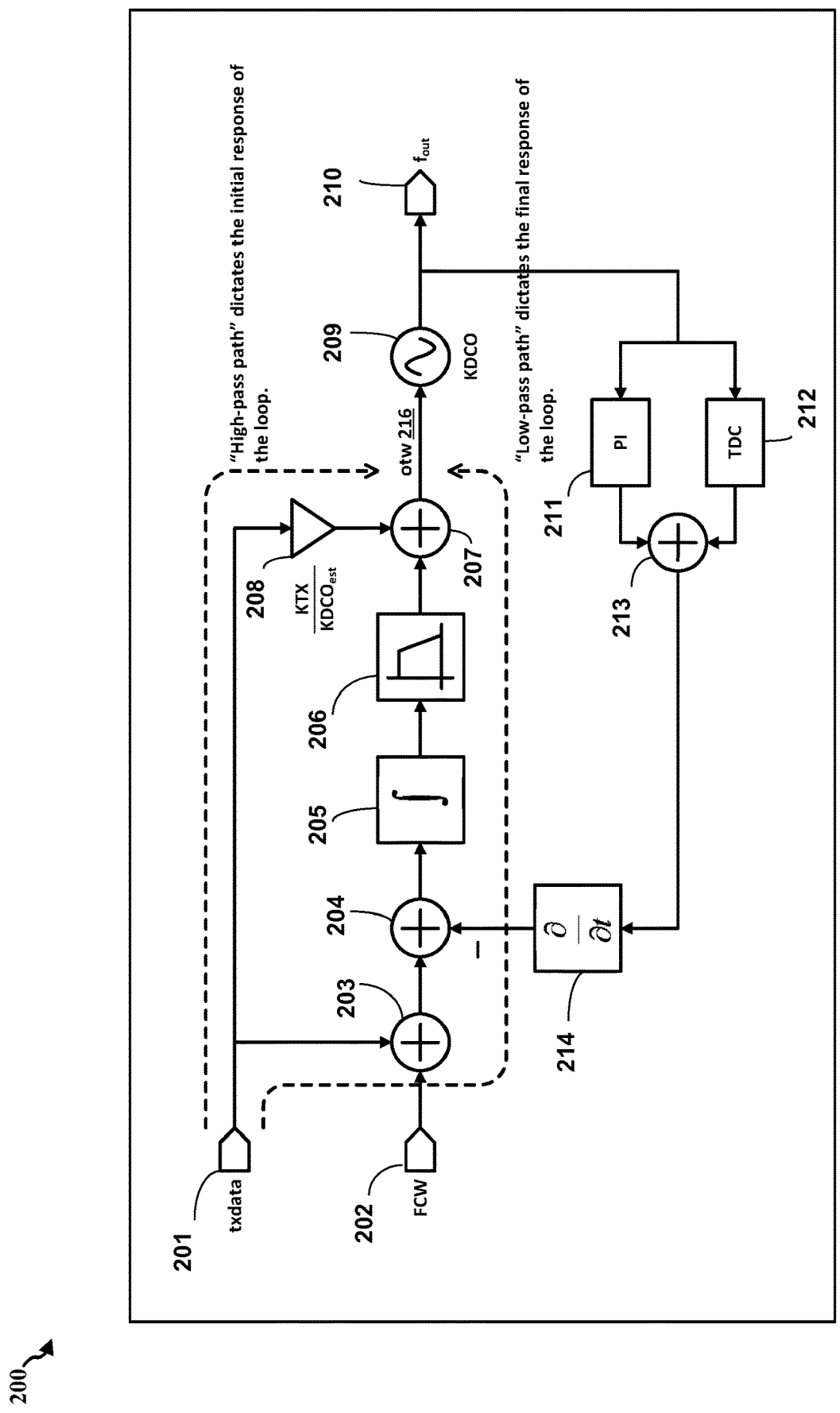
FIG. 2 is a simplified block diagram of an exemplary ADPLL in accordance with certain aspects of the disclosure.

FIG. 2 is a simplified block diagram of an exemplary ADPLL 200 in accordance with certain aspects of the disclosure. The ADPLL 200 may correspond to the ADPLL 142 of the RAT transceiver 140 of the access point 110, the ADPLL 152 of the RAT transceiver 150 of the access terminal 120 of FIG. 1, the ADPLL 400, 600, the apparatus 802/802'. The ADPLL 200 may be used (e.g., in the RAT transceiver 140 of the access point 110 and/or the RAT transceiver 150 of the access terminal 120) to carry out a modulation function in order to modulate transmit data onto a carrier signal.

In FIG. 2, the ADPLL 200 is illustrated as a number of interconnecting functional blocks. Such functional blocks may be implemented in a number of different ways, such as software stored in a memory block, e.g. memory components 128 and 118, and executed by a processor, e.g. processing system 126 and 116. Although various functional blocks are shown as distinct with their operation being separated, one or more of the functions may be carried out together and/or separately. The function of such blocks may be carried out in a digital signal processing domain.

The ADPLL 200 may receive a transmit data (txdata) signal 201 a frequency control word (FCW) signal 202 to modulate the txdata signal 201 using the DCO 209 prior to transmission to another device. The txdata signal 201 may also be input into the high-pass gain 208 using a high-pass path transfer function in order to be scaled by a factor of KTX/KDCO$_{est}$ when there is gain at the DCO 209, where KTX is a scaling factor (e.g., a predetermined gain value) determined a-priori and the KDCO is the actual gain of the DCO 209. Initially, the ADPLL 200 may use a built-in predetermined pattern for KDCO estimation. After determining the initial KDCO$_{est}$, the ADPLL 200 may use the data transmission pattern in a continuous running loop to compensate for time varying phenomena, such as oscillator pulling, in order to determine a calibrated KDCO$_{est}$ that may be used in modulating the txdata signal 201 prior to transmission.

The FCW signal 202 may be a value that is associated with the ratio Fout/Fref, where Fout is the signal output by the DCO 209 and Fref is the frequency reference signal (e.g., Fref) associated with the channel center frequency of a carrier signal. In certain configurations, the FCW signal 202 may be generated by a voltage-controlled oscillator (VCO) clock (not illustrated in FIG. 2) that is coupled to the ADPLL 200 illustrated in FIG. 2. The ADPLL 200 illustrated in FIG. 2 may use two-point modulation to generate an all pass transfer function for the input frequency data of the VCO clock.

The txdata signal 201 and FCW signal 202 may be input into an adder 203 to form digital reference information (e.g., a summing of low-pass data information and a carrier represented by the FCW value) by summing the txdata signal 201 and the FCW signal 202. The txdata signal 201 may be input using a high-pass path transfer function and the FCW signal 202 may be input using a low-pass path transfer function. The results from adder 203 may be input to another adder 204 in order to generate an error signal by subtracting the feedback information from the reference information. The feedback loop associated with FIG. 2 may operate on an error signal between the feedback path and the forward path (after adder 203) in an attempt to reduce the modulation error to zero.

The error signal may be passed to an integrator 205 that integrates the error signal over time. The output from the integrator 205 may be filtered by a low-pass filter 206 to remove high frequency components from the error signal. The filtered error signal may be input into adder 207.

The ADPLL 200 may scale the txdata signal 201 by a factor of KTX/KDCO$_{est}$, where KTX is a scaling factor established a-priori and KDCO$_{est}$ is an estimated KDCO. KDCO$_{est}$ may be used to scale KTX when the actual KDCO of the ADPLL 200 is not equal to the KTX. For example, if the gain (KTX) needs to be 25 kHz/least significant bit (LSB), and the desired frequency deviation is ±250 kHz, then the wireless device (e.g., modem, ADPLL, etc.) may generate a signal of ±10 codes. Because the actual KDCO may differ from the 25 kHz/LSB assumption, the ADPLL 200 may adjust KTX using KDCO$_{est}$. Prior to transmission of the txdata signal 201 to another device, the ADPLL 200 may estimate the KDCO$_{est}$ using various techniques such as, e.g., linear averaging estimation, locking the ADPLL 200 to two different frequencies. The two frequencies may be set by the FCW signal 202. For example, the two frequencies may be 1 MHz apart. A determination of the averaged otw codes for the two frequencies may be made. The gain may be determined as Df/Dcode, where Df is the 1 MHz in the present example and Dcode is the difference between the two averaged otw codes associated with the two different frequencies. Estimating the KDCO prior to transmitting the carrier signal may be referred to as static estimation.

In addition, the scaled txdata signal may be input into adder 207, which sums the low-pass path information (described below) and the scaled txdata signal to create an oscillator tuning word (otw) signal 216. The otw signal 216 may be input into the DCO 209 and may be used for modulating the frequency of the DCO 209. The frequency of the DCO 209 may be modulated using the otw signal 216 in order to correct for any gains at the DCO 209. Fout 210 (e.g., the output of the DCO 209) may be sent to a power amplifier (PA) (not illustrated in FIG. 2) that is coupled to the ADPLL 200. The PA may send Fout 210 to a transmitter (e.g., antenna) for transmission to another wireless device. In certain aspects, Fout 210 may be modulated txdata signal. By modulating the txdata signal 201 time varying phenomenon (e.g., oscillator pulling) in order to determine $KDCO_{est}$, as described below.

For example, Fout 210 may also be sent to the phase incrementer (PI) 211 (e.g., a counter) that counts the number of VCO clock periods within a reference clock period. When the PI 211 is configured to count integer multiples of the VCO clock, a time-to-digital converter (TDC) 212 may be included in the ADPLL 200 to evaluate the fractional part of the VCO clock periods.

The integer and fractional parts of the VCO clock periods may be summed by adder 213 to generate feedback phase information (e.g., associated with the VCO phase) with respect to the reference phase. The output of adder 213 may be input into differentiator 214 that converts the feedback phase information into feedback frequency information. The feedback frequency information may be compared with the reference information (e.g., a summation of txdata signal 201 and FCW signal 202).

An accurate estimation of KDCO may reduce the complexity and increase the performance of the high-pass path transfer function. The KDCO at any point in time may be a function of frequency as well as the current state of process of the wireless device, voltage input, and the temperature (PVT) of the ADPLL 200. For two-point modulation, as described in the present disclosure, the modulation accuracy may depend on the estimation of KDCO.

In certain implementations, the KDCO may be estimated statically (e.g., prior to the start of a data transmission). However, certain scenarios, such as oscillator pulling, voltage standing wave ratio (VSWR) variations, rapidly varying temperatures, or other physical parameters of the ADPLL 200, may affect the accuracy of the KDCO estimation, etc. Thus may be beneficial to estimate the KDCO continuously during the modulation of a data transmission and while sending the data (e.g., on-the-fly KDCO estimation).

Transmitters may be affected by modulation distortion due to oscillator pulling caused by the transmitted RF output (e.g., Fout 210) and supply-ground coupling of extraneous noise sources. With respect to polar transmitters, when the instantaneous transmitted frequency at the system-on-chip (SoC) output, PA output, or a harmonic of the output, are similar to the resonant frequency of the DCO 209, a frequency pulling force at the DCO 209 may be created. Various mechanisms exist through which such pulling can occur. For example, the aggressing signal may cause capacitance changes and/or magnetic interference in the resonance circuit (e.g., of the DCO 209) that correspond to the amplitude fluctuations in the resonance circuit, thereby creating parasitic frequency modulation at the DCO 209. When a frequency pulling force occurs at the DCO 209, the $KDCO_{est}$ may change during operation. An example of how oscillator pulling may cause an error KDCO estimation is described below in connection with FIG. 3.

Because the KDCO of the DCO 209 may vary throughout the modulation process it may be beneficial to perform on-the-fly-KDCO estimation in order to update the $KDCO_{est}$ continuously during modulation of a data transmission and/ or during the sending of the data, as described above in connection with FIG. 2. In other words, any change in $KDCO_{est}$ during modulation may be detected and corrected for in order to increase the accuracy of the system.

The present disclosure provides a mechanism to perform on-the-fly-KDCO estimation in order to avoid a degradation in the transmitter's performance caused by an oscillator pulling force. For example, an ADPLL of the present disclosure may include a cost function and an update function in addition to the other blocks described above in connection with FIG. 2. The cost function and the update function may be used by the ADPL in order to perform on-the-fly-KDCO estimation, e.g., as described below in connection with FIGS. 4-9.

Figure 3:
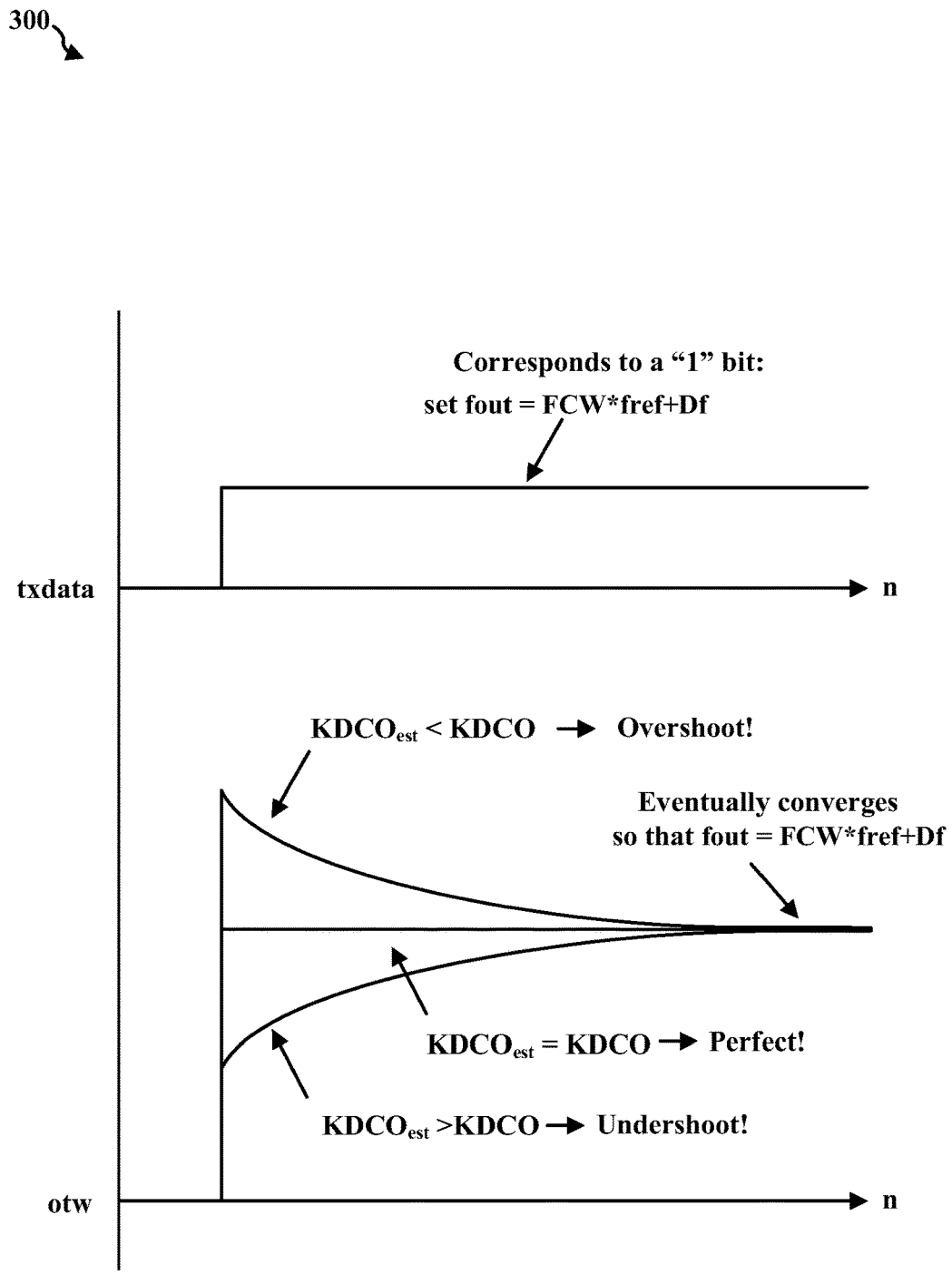
FIG. 3 is a graphical illustration of the effect of oscillator pulling in polar transmitters in accordance with certain aspects of the disclosure.

FIG. 3 is a graphical illustration 300 of the effect of oscillator pulling in polar transmitters in accordance with certain aspects of the disclosure. In the example illustrated in FIG. 3, assume the txdata signal 201 illustrated in FIG. 2 is associated with a '1' bit value, and that fout=FCW*fref+ Df, where Df=KDCO*KTX/$KDCO_{est}$*txdata. As mentioned above, when oscillator pulling is coupled to the DCO 209, the $KDCO_{est}$ may change substantially, as seen in FIG. 3. Hence, $KDCO_{est}$ may need to be updated in order to avoid a degradation in the transmitter's performance. The accuracy of $KDCO_{est}$ may be determined by monitoring the shape (e.g., convex, concave, etc.) of the otw signal 216 during transmission.

Figure 4:
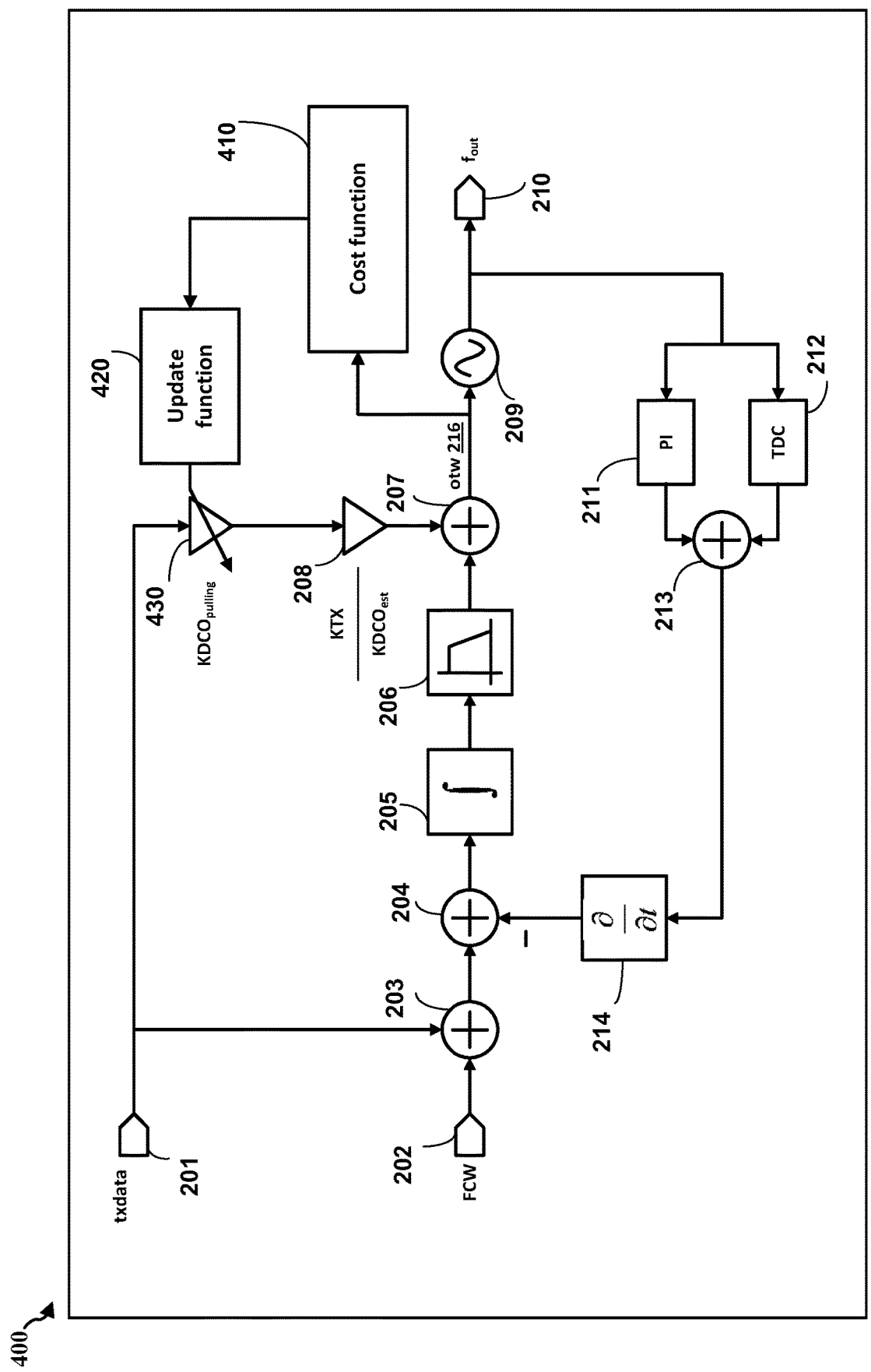
FIG. 4 is a simplified block diagram of an exemplary ADPLL that may be configured for estimating a gain at a digitally controlled oscillator (DCO) in accordance with certain aspects of the disclosure.

FIG. 4 is a simplified block diagram of an exemplary ADPLL 400 that may be configured for on-the-fly-KDCO estimation in accordance with certain aspects of the disclosure. The ADPLL 400 may correspond to the ADPLL 142 of the RAT transceiver 140 of the access point 110, the ADPLL 152 of the RAT transceiver 150 of the access terminal 120 of FIG. 1, or the ADPLL in FIG. 2. The ADPLL 400 may be used in the RAT transceiver 140 of the access point 110 and/or the RAT transceiver 150 of the access terminal 120 to carry out the operation of modulating the transmit data (e.g., modulation function) onto a carrier signal for transmission from the respective devices. Txdata signal 201, FCW signal 202, otw signal 216, Fout 210, and functional blocks 203, 204, 205, 206, 207, 208, 209, 211, 212, 213, and 214 described above in connection with FIG. 2 are also included in the ADPLL 400 illustrated in FIG. 4.

Referring to FIG. 4, the otw signal 216 may be input into the cost function 410 prior to being input into the DCO 209 in order to correct for any errors in $KDCO_{est}$ that may be caused by, e.g., oscillator pulling (e.g., $KDCO_{pulling}$). The cost function 410 may be convex in shape and have an absolute minimum at which an optimal KDCO calibration occurs. The cost function 410 may extract a number of parameters from the otw signal 216 (e.g., the direct current (DC) component of the otw signal 216, etc.) in order to detect if the $KDCO_{est}$ matches the actual KDCO of the DCO 209. In certain implementations, the cost function 410 may be represented by equation 1 seen below, wherein C is the cost function, PAR is an operator representing the peak-average-ratio of the otw signal 216 that is a function of "↑otw−DC(otw)|" where otw is the value of the otw signal 216, and DC is the mean value, average value, or DC value of the otw signal 216.

$$C=PAR(otw-DC(otw)|) \qquad \text{equation 1}$$

Upon extracting the parameter(s) from the otw signal 216, the cost function 410 may send the modified otw signal to the update function 420. The update function 420 may manipulate the modified otw signal in order to obtain a signal that corrects the initial $KDCO_{est}$ when the KDCO of the DCO 209 deviates from $KDCO_{est}$. Additional details associated with generating the cost function are described in connection with FIG. 5.

In certain other configurations, the cost function 410, here C=PAR, may be based on a normalized error of PAR−1 or on the absolute error otw−ref(otw). Our ideal reference value of otw at any time, ref(otw), may be approximated as the average of otw, μt(otw), during peak or anti-peak intervals respectively. Normalizing the absolute error with μt(otw) we end up with otw/μt(otw)−1 where the peak and anti-peak of otw/μt(otw) is what gets calculated as PAR. As an implementation detail, within the PAR function, peak, anti-peak and average values are reset and sampled for each peak and anti-peak interval based on for example transitions in txdata 201. In the case of where we have a reference model that would give us ref(otw) then we may use the cost function C=otw−ref(otw)+1, as an implementation of PAR, where +1 is added to be compatible with the assumed updated function that subtracts the assumed bias of PAR which is unity. A cost function 410 based on ref(otw) may be updated for each sample while the cost function 410 based on PAR calculation may be updated once per each peak/anti-peak interval. A reference model implementing ref(otw) may be based on FIG. 2 modified with KDCO (209) replaced by a model and with ref(otw) taken as otw (216). The implementation is more costly in terms of hardware than implementing a cost function 410 based on PAR as described in this invention. In certain other configurations, the cost function 410 may be determined by calculating peak, anti-peak and average values within its interval; such models may be based on mentioned reference model or simply some function of txdata 201.

For example, peak and anti-peak does not have to be the actual peak of anti-peak from a mathematical point of view. Instead, one value or sample may be selected to represent the overshoot and undershoot of a peak and anti-peak, or simply the error, and still be able to represent PAR with a quantity with the property of having an ideal converged value of 1. It should be understood that modifications, exemplified above, of the cost function 410 is within the scope of the present disclosure.

The update function 420 may be configured to control $KDCO_{pulling}$ (e.g., or other errors in KDCO estimation caused by VSWR, temperature, etc.) and dynamically rescale the $KDCO_{est}$ in order to match with the KDCO at the DCO 209. In other words, the update function 420 may use the cost function 410 to determine/update the coefficient $KDCO_{pulling}$ at the high-pass gain 430 or send an output to the high-pass gain 430 that determines/updates $KDCO_{pulling}$ until the optimal estimation of the KDCO is achieved. Additional details of the cost function 410, the update function 420, and the high-pass gain 430 are described in connection with FIG. 6.

Figure 5:
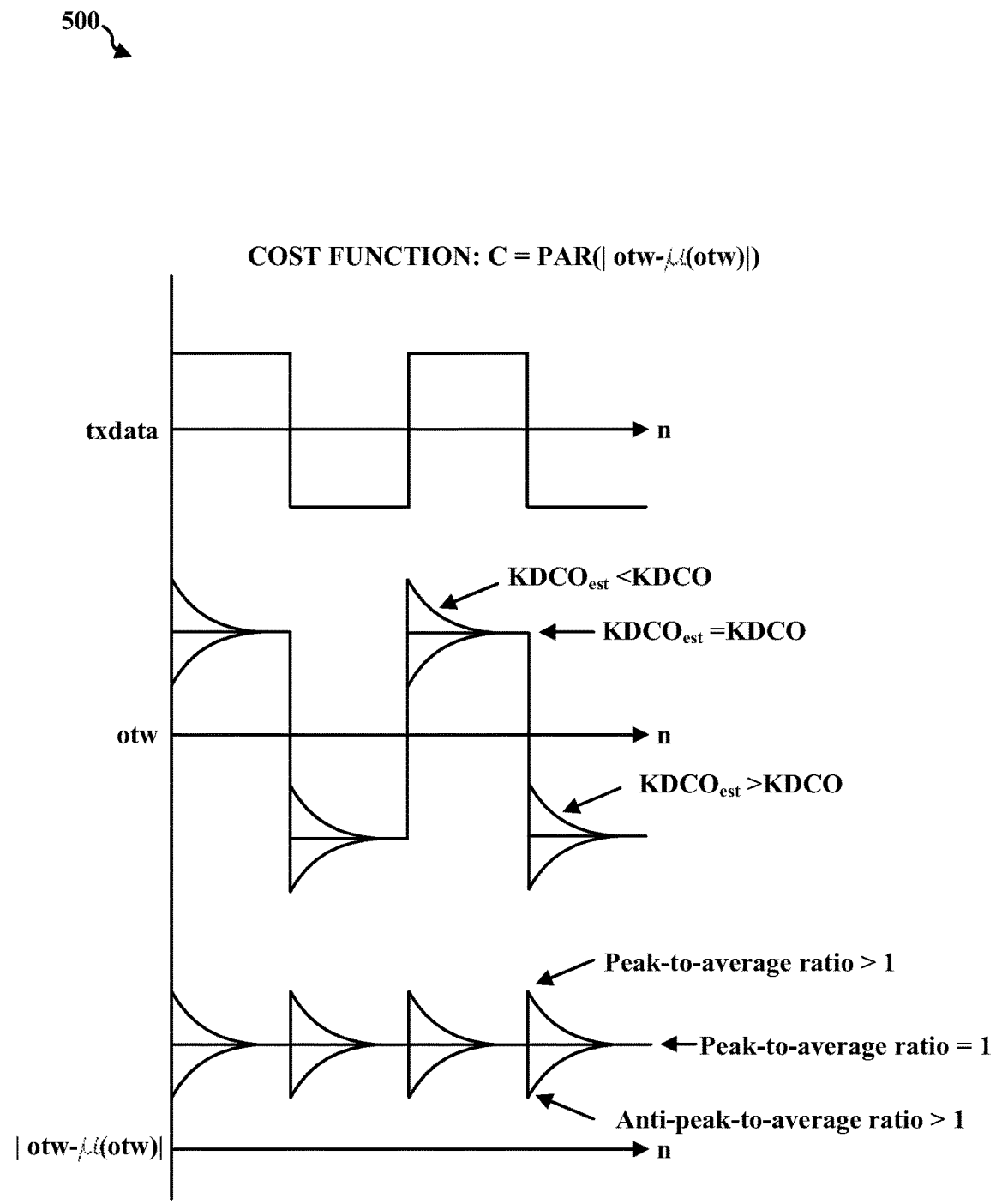
FIG. 5 is a graphical illustration generating a cost function using the peak-to-average ratio (PAR) of the otw signal in accordance with certain aspects of the disclosure.

FIG. 5 is a graphical illustration 500 of how the cost function 410 may be generated using the PAR of the otw signal in accordance with certain aspects of the disclosure.

In certain configurations, the cost function (C) may be created from data available in the digital domain. In the example of FIG. 5, the otw signal 216 may be used. In order to generated the cost function 410, three sub-functions may be defined with respect to the otw signal 216. The three sub-functions may include, the peak value of the otw signal 216 within a transmission symbol, the average value of the otw signal within the same transmission symbol, and the peak or anti-peak extractor (e.g., see FIG. 6). The cost function 410 may be defined as the ratio between the peak sub-function and the average sub-function. The ratio between the peak sub-function and the average sub-function may be referred to as the PAR. The peak sub-function or anti-peak sub-function may be used to determine the direction of the update function 420. As illustrated in FIG. 5, the PAR may have an absolute minimum of 1 that may be useful in modulation patterns (e.g., without filtering). The absolute minimum of the PAR may be independent of the data transmission pattern.

Figure 6:
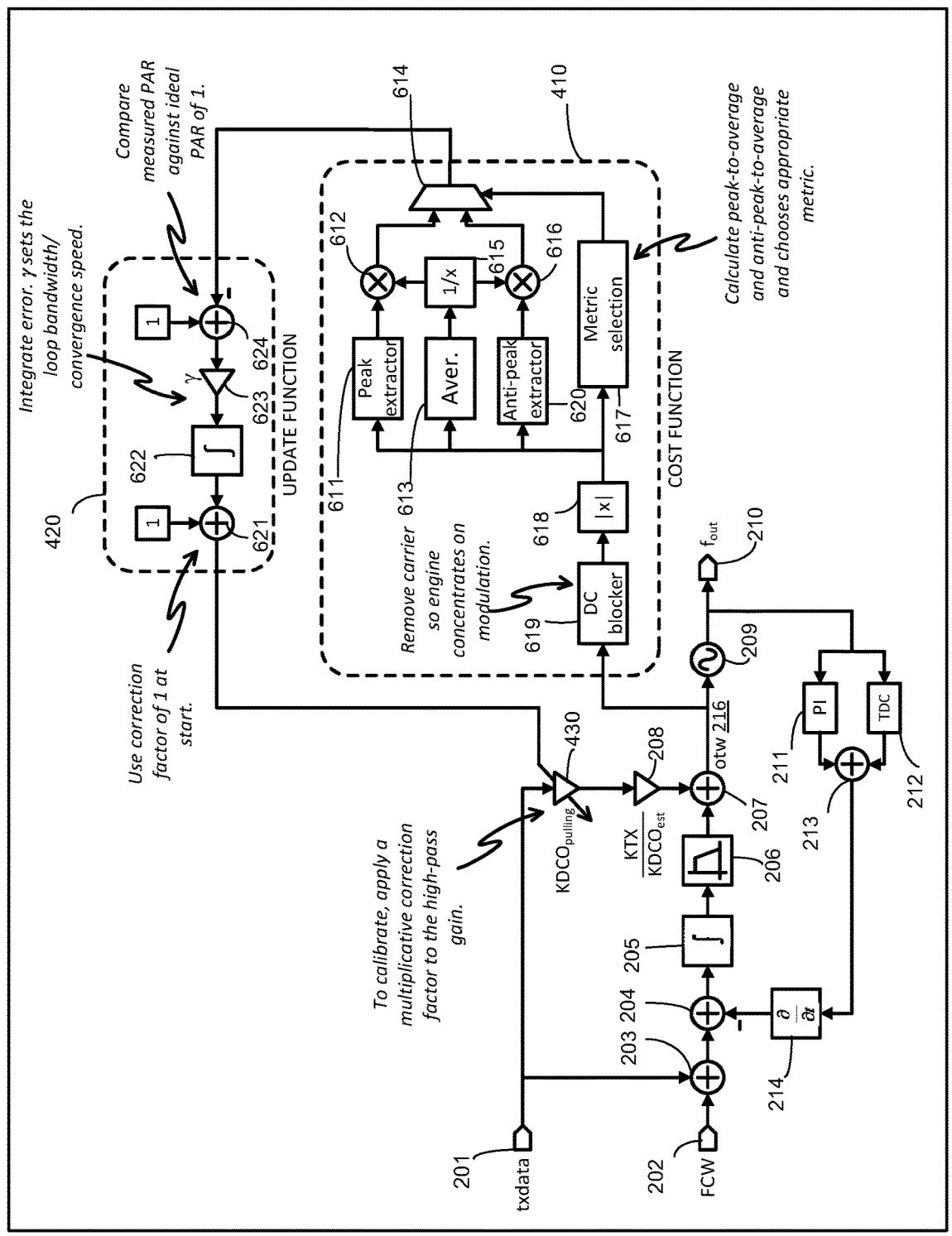
FIG. 6 is a simplified block diagram of an exemplary ADPLL that may be configured for estimating a gain at a DCO in accordance with certain aspects of the disclosure.

FIG. 6 is a simplified block diagram of an exemplary ADPLL 600 that may be configured for on-the-fly-KDCO estimation in accordance with certain aspects of the disclosure. The ADPLL 600 may correspond to the ADPLL 142 of the RAT transceiver 140 of the access point 110, the ADPLL 152 of the RAT transceiver 150 of the access terminal 120 of FIG. 1, or the ADPLL in FIG. 2. The ADPLL 600 may be used in the RAT transceiver 140 of the access point 110 and/or the RAT transceiver 150 of the access terminal 120 to carry out the operation of modulating the transmit data (e.g., modulation function) onto a carrier signal for transmission from the respective devices. Txdata signal 201, FCW signal 202, otw signal 216, Fout 210, and functional blocks 203, 204, 205, 206, 207, 208, 209, 211, 212, 213, 214, 410, 420, and 430 described above in connection with FIG. 2 or FIG. 4 are also included in the bock diagram of the ADPLL 600 illustrated in FIG. 6.

Referring to FIG. 6, the cost function 410 may include a DC blocker 619 that may be configured to remove the DC signal portion of the otw signal 216 in order to generate a modified otw signal (e.g., the output of the DC blocker 619 may be "otw−DC(otw)"). The modified otw signal may be input into an absolute value function 618 to obtain the absolute value of the analog current (AC) portion of the modified otw signal (e.g., the output of the absolute value function 618 may be "|otw−DC(otw)|"). The absolute value of the modified otw signal may be input into one or more of the metric selection block 617, anti-peak extractor 620, the averaging block 613, and/or the peak extractor 611.

The peak extractor 611 may trigger and output the initial otw jump (e.g., either high or low as seen in FIG. 3) when the txdata signal 201 is larger than the average value. The averaging block 613 may be configured to average the AC component over N-samples. The value of N may be arbitrary, but by way of example, if one symbol period is used, averaging block 613 may average 40 samples (e.g., 40 MHz reference clock and 1 Msymb/sec data rate). The averaging block 613 may send the average value of the AC portion of the otw signal 216 to the reciprocal block 615. The anti-peak extractor 620 may be configured to trigger and output the initial otw jump when the txdata signal 201 is smaller than the average value.

The reciprocal block 615 may be configured to obtain the reciprocal of the average value of the AC signal portion of otw signal 216. The reciprocal of the average value of the AC signal portion of the otw signal 216 may be input into multiplier 612 and/or multiplier 616.

The metric selection block 617 may be configured to calculate the PAR and/or the anti-PAR of the AC signal portion of the otw signal 216 in order to determine whether the AC signal portion is ascending (e.g., peak) or descending (anti-peak). Based on the determination, the metric selection block 617 may be configured to select the appropriate metric (e.g., that is related to either the peak or anti-peak) that is passed to the multiplexer (MUX) 614.

Multiplier 612 may be configured to multiply the peak value received from the peak extractor 611 by the reciprocal of the average value received from the averaging block 613 in order to obtain the PAR of the otw signal 216. Multiplier 616 may be configured to multiply the anti-peak value received from the anti-peak extractor 620 by the reciprocal of the average value received from the averaging block 613 in order to obtain the anti-PAR of the otw signal 216.

MUX 614 may be controlled by the metric selection block 617 and receive a signal indicating which metric to pass to update function 420. The MUX 614 may pass information associated with the PAR and either the peak value or anti-peak value (e.g., depending on whether the otw signal 216 is ascending or descending) to adder 624. When there is a peak, the otw signal 216 will be descending, and when there is an anti-peak, the otw signal 216 will be ascending. The update function 420 may use the PAR and either the peak value or the anti-peak value to determine and/or update a correction factor (e.g., the $KDCO_{pulling}$) that may be used by the ADPLL 600 to ensure that $KDCO_{est}$ equals the actual KDCO of the DCO 209.

The PAR may be input into adder 624, and adder 624 may be configured to remove the bias in the PAR. The bias may be a value of 1 because when the PAR is 1, the KDCO is estimated correctly. The PAR without the bias may be input into a gain factor 623. The gain factor 623 may remove the convergence speed and stability of the loop by adjusting the gain. The integrator 622 may receive the PAR. The integrator 622 may be configured to integrate the error in the PAR in order to update and remove any random fluctuations. Any number of transmitted symbols may be used in integrating the error, and the larger the number of symbols used, the more accurately the integrator 622 may be able to remove random fluctuations, but the slower the algorithm is to converge. Upon removing the random fluctuations from the PAR, the signal may be input into adder 621, which may add the bias back to the signal in order to generate a correction factor (e.g., $KDCO_{pulling}$) that is input into high-pass gain 430. The high-pass gain 430 may use $KDCO_{pulling}$ to calibrate $KDCO_{est}$.

The high-pass gain 208 may then input an otw signal 216 that includes the corrected $KTX/KDCO_{est}$ value into the DCO 209. Using the corrected $KTX/KDCO_{est}$, the DCO 209 in the ADPLL 600 may be able to correctly modulate the txdata signal 201 even when KDCO fluctuations occur during the modulation process.

By monitoring the otw signal 216 the ADPLL 400 of the present disclosure may detect in real time if the KDCO is deviating from the initial estimation ($KDCO_{est}$) and in which direction.

Figure 7A:
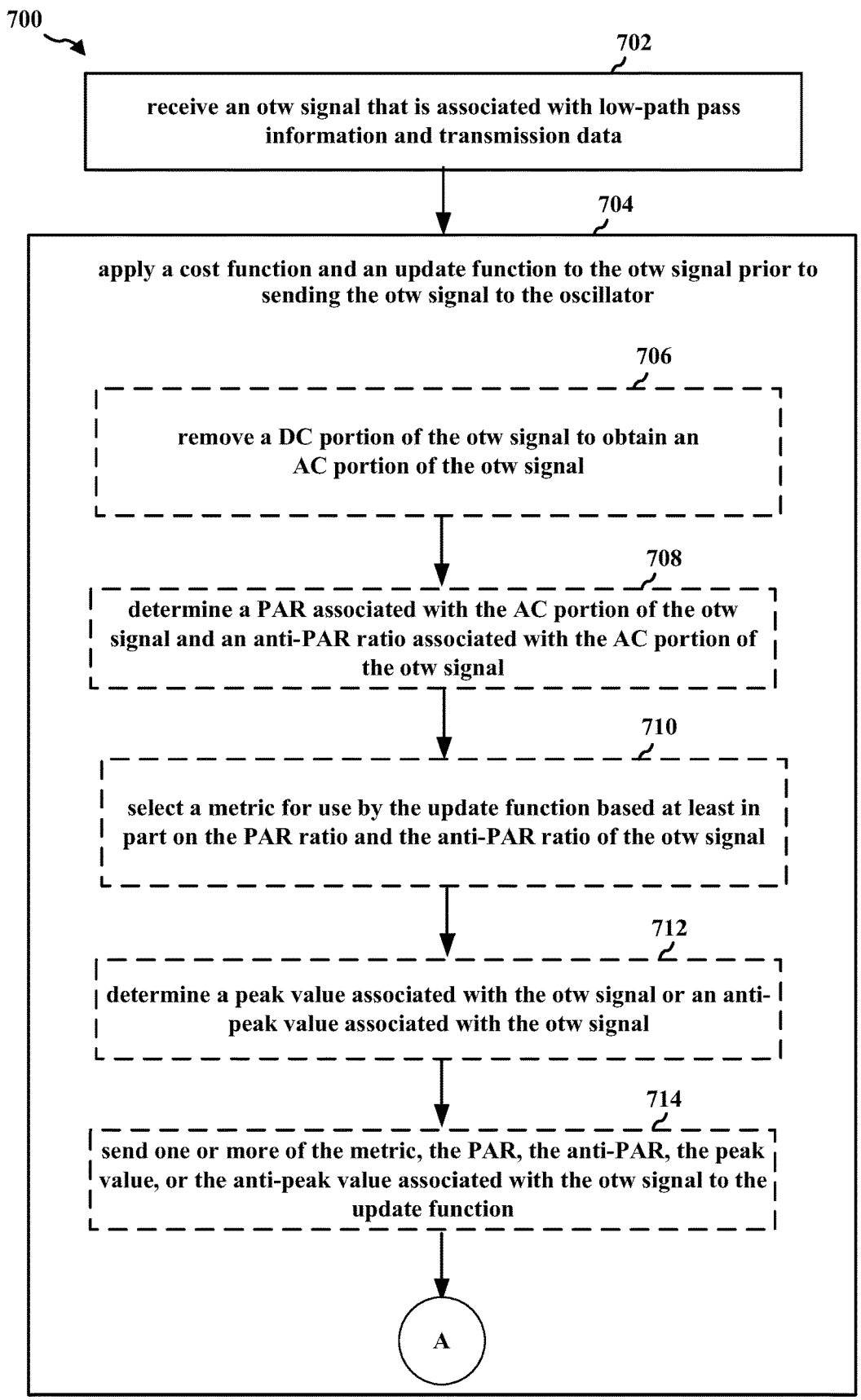
FIGS. 7A and 7B are a flowchart of a method of wireless communication.
Figure 7B:
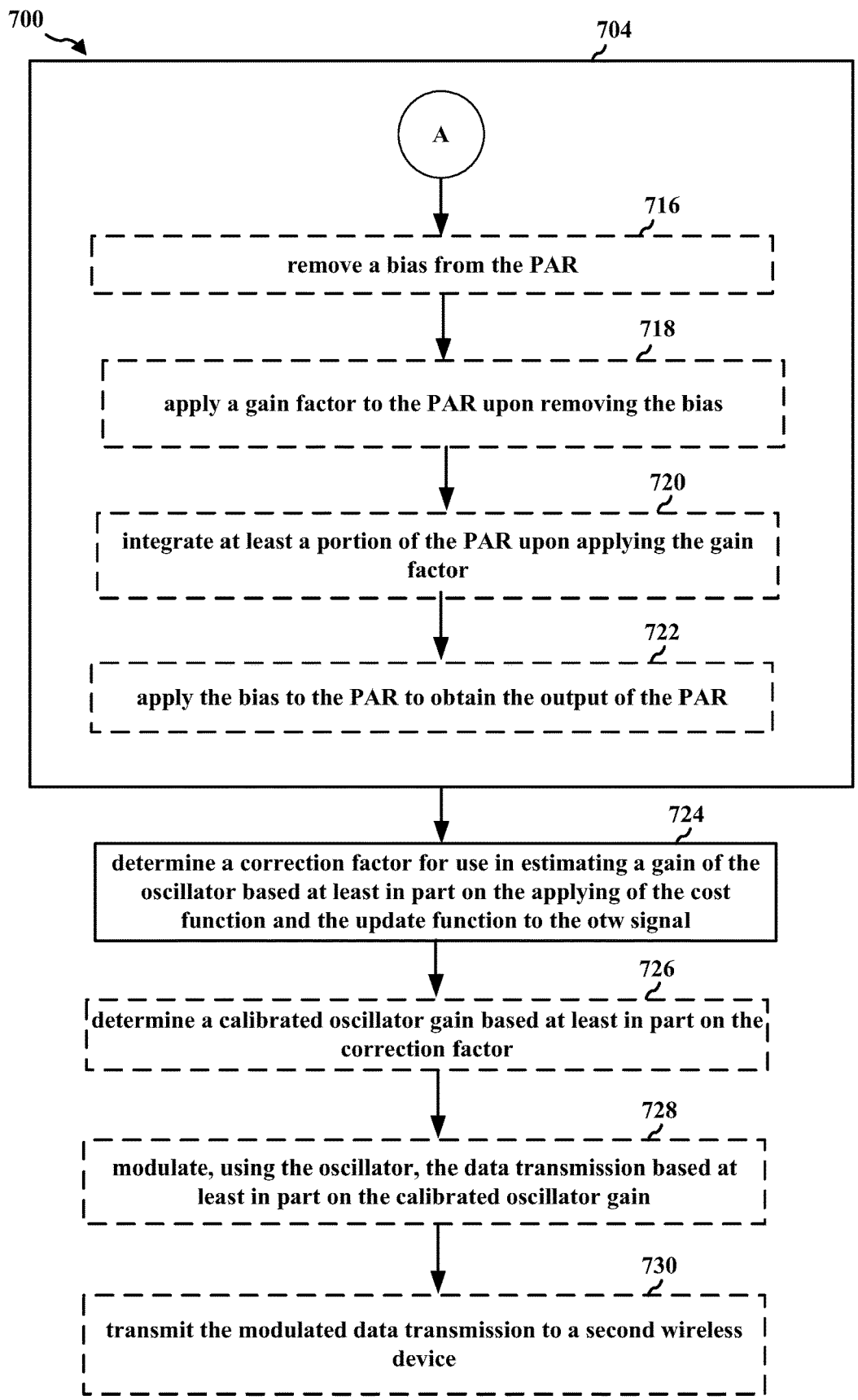

FIGS. 7A and 7B are a flowchart 700 of a method of wireless communication. The method may be performed by a first wireless device (e.g., the access point 110, access terminal 120, the ADPLL 142 of the RAT transceiver 140 of the access point 110, the ADPLL 152 of the RAT transceiver 150 of the access terminal 120 of FIG. 1, the ADPLL 200, 400, 600, the apparatus 802/802'). In FIGS. 7A and 7B, optional operations are depicted with dashed lines.

Referring to FIG. 7A, at 702, the first wireless device may receive an otw signal that is associated with low-path pass information and transmission data. For example, referring to FIGS. 4 and 6, the otw signal 216 may be input into the cost function 410 prior to being input into the DCO 209 in order to correct for any errors in $KDCO_{est}$ that may be caused by, e.g., oscillator pulling (e.g., $KDCO_{pulling}$).

At 704, the first wireless device may apply a cost function and an update function to the otw signal prior to sending the otw signal to an oscillator. For example, referring to FIG. 4, the cost function 410 may send the modified otw signal to the update function 420. The update function 420 may manipulate the modified otw signal in order to obtain a signal that corrects the initial $KDCO_{est}$ when the KDCO of the DCO 209 deviates from $KDCO_{est}$.

At 706, the first wireless device may apply the cost function to the otw signal by removing a DC portion of the otw signal to obtain an AC portion of the otw signal. For example, referring to FIG. 6, the cost function 410 may include a DC blocker 619 that may be configured to remove the DC signal portion of the otw signal 216 in order to generate a modified otw signal.

At 708, the first wireless device may apply the cost function to the otw signal by determining a PAR associated with the AC portion of the otw signal and an anti-PAR ratio associated with the AC portion of the otw signal. For example, referring to FIG. 6, the metric selection block 617 may be configured to calculate the PAR and/or the anti-PAR of the AC signal portion of the otw signal 216 in order to determine whether the AC signal portion is ascending (e.g., anti-peak) or descending (e.g., peak).

At 710, the first wireless device may apply the cost function to the otw signal by selecting a metric for use by the update function based at least in part on the PAR ratio and the anti-PAR ratio of the otw signal. For example, referring to FIG. 6, based on the determination of whether the AC signal portion is ascending (e.g., anti-peak) or descending (e.g., peak), the metric selection block 617 may be configured to select the appropriate metric for use by the update function 420 that is passed to the multiplexer (MUX) 614. The metric may be related to either the peak of the otw signal or the anti-peak of the otw signal depending on whether the otw signal is descending or ascending.

At 712, the first wireless device may apply the cost function to the otw signal by determining a peak value associated with the otw signal or an anti-peak value associated with the otw signal. For example, referring to FIG. 6, the peak extractor 611 may trigger and output the initial otw jump when the txdata signal 201 is larger than the average value. The anti-peak extractor 620 may be configured to trigger and output the initial otw jump when the txdata signal 201 is smaller than the average value.

At 714, the first wireless device may apply the cost function to the otw signal by sending one or more of the metric, the PAR, the anti-PAR, the peak value, or the anti-peak value associated with the otw signal to the update function. For example, referring to FIG. 6, the MUX 614 may receive the metric and PAR from the metric selection block 617, the peak value from the peak extractor 611, and the anti-peak value from the anti-peak extractor 620.

Referring to FIG. 7B, at 716, the first wireless device may apply the update function to the otw signal by removing a bias from the PAR. For example, referring to FIG. 6, the PAR may be input into adder 624, and adder 624 may be configured to remove the bias in the PAR. The bias may be a value of 1 because when the PAR is 1, the KDCO is estimated correctly.

At 718, the first wireless device may apply the update function to the otw signal by applying a gain factor to the PAR upon removing the bias. For example, referring to FIG. 6, The PAR without the bias may be input into a gain factor 623, the gain factor 623 may remove the convergence speed and stability of the loop by adjusting the gain.

At 720, the first wireless device may apply the update function to the otw signal by integrating at least a portion of the PAR upon applying the gain factor. For example, referring to FIG. 6, the integrator 622 may be configured to integrate the error in the PAR in order to update and remove any random fluctuations. Any number of transmitted symbols may be used in integrating the error, and the larger the number of symbols used, the more accurately the integrator 622 may be able to remove random fluctuations, but the slower the algorithm is to converge.

At 722, the first wireless device may apply the update function to the otw signal by applying the bias to the PAR to obtain the output of the PAR. For example, referring to FIG. 6, upon removing the random fluctuations from the PAR, the signal may be input into adder 621, which may add the bias back to the signal in order to generate a correction factor (e.g., $KDCO_{pulling}$) that is input into high-pass gain 430.

At 724, the first wireless device may determine a correction factor for use in estimating a gain of the oscillator based at least in part on the applying of the cost function and the update function to the otw signal. For example, referring to FIG. 6, to update function 420 may use the PAR and either the peak value or the anti-peak value to determine and/or update a correction factor (e.g., the $KDCO_{pulling}$) that may be used by the ADPLL 600 to ensure that $KDCO_{est}$ equals the actual KDCO of the DCO 209.

At 726, the first wireless device may determine a calibrated oscillator gain based at least in part on the correction factor. For example, referring to FIG. 6, the high-pass gain 430 may use $KDCO_{pulling}$ to calibrate $KDCO_{est}$.

At 728, the first wireless device may modulate, using the oscillator, the data transmission based at least in part on the calibrated oscillator gain. For example, referring to FIG. 6, using the corrected $KTX/KDCO_{est}$, the DCO 209 in the ADPLL 600 may be able to correctly modulate the txdata signal 201 even when KDCO fluctuations occur during the modulation process.

At 730, the first wireless device may transmit the modulated data transmission to a second wireless device. For example, referring to FIG. 6, Fout 210 (e.g., the output of the DCO 209) may be sent to a PA (not illustrated in FIG. 6) that is coupled to the ADPLL 200. The PA may send Fout 210 to a transmitter (e.g., antenna) for transmission to another wireless device. In certain aspects, Fout 210 may be the txdata signal that has be modulated using a calibrated $KDCO_{est}$ scaling factor that compensates for time varying phenomenon such as, e.g., oscillator pulling.

Figure 8:
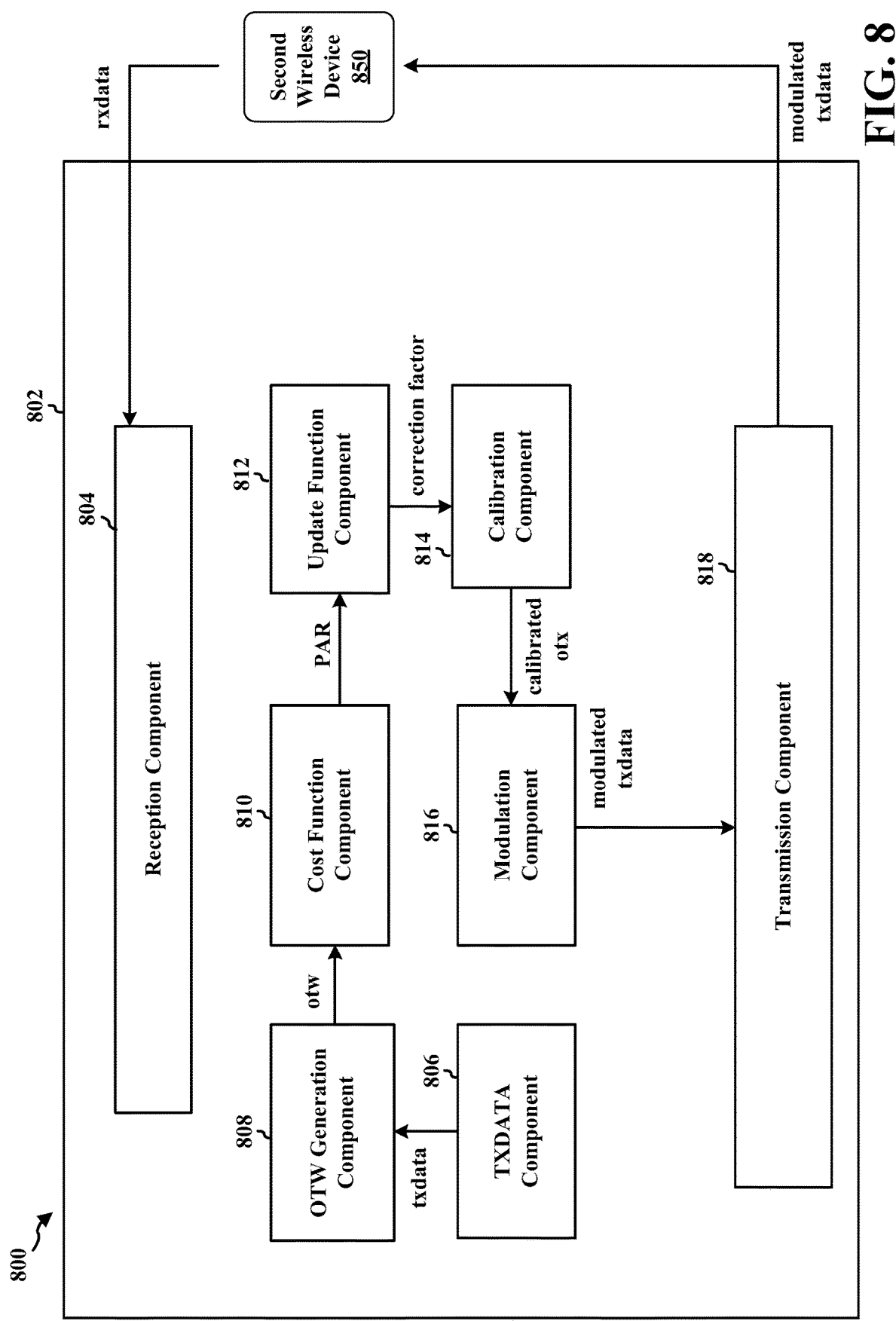
FIG. 8 is a conceptual data flow diagram illustrating the data flow between different means/components in an exemplary apparatus.

FIG. 8 is a conceptual data flow diagram 800 illustrating the data flow between different means/components in an exemplary apparatus 802. The apparatus may be a first wireless device (e.g., the access point 110, access terminal 120, the ADPLL 142 of the RAT transceiver 140 of the access point 110, the ADPLL 152 of the RAT transceiver 150 of the access terminal 120 of FIG. 1, the ADPLL 200, 400, 600, the apparatus 802/802') in communication with a second wireless device 850 (e.g., e.g., the access point 110, access terminal 120, the ADPLL 142 of the RAT transceiver 140 of the access point 110, the ADPLL 152 of the RAT transceiver 150 of the access terminal 120 of FIG. 1, the ADPLL 200, 400, 600). The apparatus may include a reception component 804, a txdata component 806, an otw generation component 808, a cost function component 810, an update function component 812, a calibration component 814, a modulation component 816, and a transmission component 818.

The txdata component 806 may be configured to generate one or more txdata packets that are sent to the otw generation component 808. The otw generation component 808 may be configured to generate an otw signal based at least in part on the txdata transmission received from the txdata component 806 and an FCW signal (e.g., low-path pass information). The otw generation component 808 may be configured to send the otw signal to the cost function component 810.

The cost function component 810 and/or the update function component 812 may be configured to apply a cost function to the otw signal prior to sending the otw signal to the modulation component 816 (e.g., an oscillator or DCO). In certain aspects, the cost function component 810 may be configured to apply the cost function to the otw signal by removing a DC portion of the otw signal to obtain an AC portion of the otw signal. In certain other aspects, the cost function component 810 may be configured to apply the cost function to the otw signal by determining a PAR ratio associated with the AC portion of the otw signal and an anti-PAR ratio associated with the AC portion of the otw signal. In certain aspects, the cost function component 810 may be configured to apply the cost function to the otw signal by selecting a metric for use by the update function based at least in part on the PAR ratio and the anti-PAR ratio of the otw signal. In certain other aspects, the cost function component 810 may be configured to apply the cost function to the otw signal by determining a peak value associated with the otw signal or an anti-peak value associated with the otw signal. In certain other aspects, the cost function component 810 may be configured to apply the cost function to the otw signal by sending one or more of the metric, the PAR, the anti-PAR, the peak value, or the anti-peak value associated with the otw signal to the update function.

The update function component 812 may be configured to apply the cost function to the otw signal by removing a bias from the PAR. In certain aspects, the update function component 812 may be configured to apply the cost function to the otw signal by applying a gain factor to the PAR upon removing the bias. In certain other aspects, the update function component 812 may be configured to apply the cost function to the otw signal by integrating at least a portion of the PAR upon applying the gain factor. In certain other aspects, the update function component 812 may be configured to apply the cost function to the otw signal by applying the bias to the PAR to obtain the output of the PAR. In certain configurations, the update function component 812 may be configured to determine a correction factor for use in estimating a gain of the oscillator based at least in part on the applying of the cost function and the update function to the otw signal. The update function component 812 may be configured to send the correction factor the calibration component 814.

In certain configurations, the calibration component 814 may be configured to determine a calibrated oscillator gain based at least in part on the correction factor. The calibrated oscillator gain may be send to the modulation component 816 (e.g., in a modified otw signal).

In certain configurations, the modulation component 816 may be configured to modulate, using the oscillator, the data transmission based at least in part on the calibrated oscillator gain. The modulated data transmission (e.g., modulated txdata) may be sent to the transmission component 818.

The transmission component 818 may be configured to send the modulated txdata to the second wireless device 850. The reception component 804 may be configured to receive data (e.g., rxdata) from the second wireless device 850.

The apparatus may include additional components that perform each of the blocks of the algorithm in the aforementioned flowcharts of FIGS. 7A and 7B. As such, each block in the aforementioned flowcharts of FIGS. 7A and 7B may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 9:
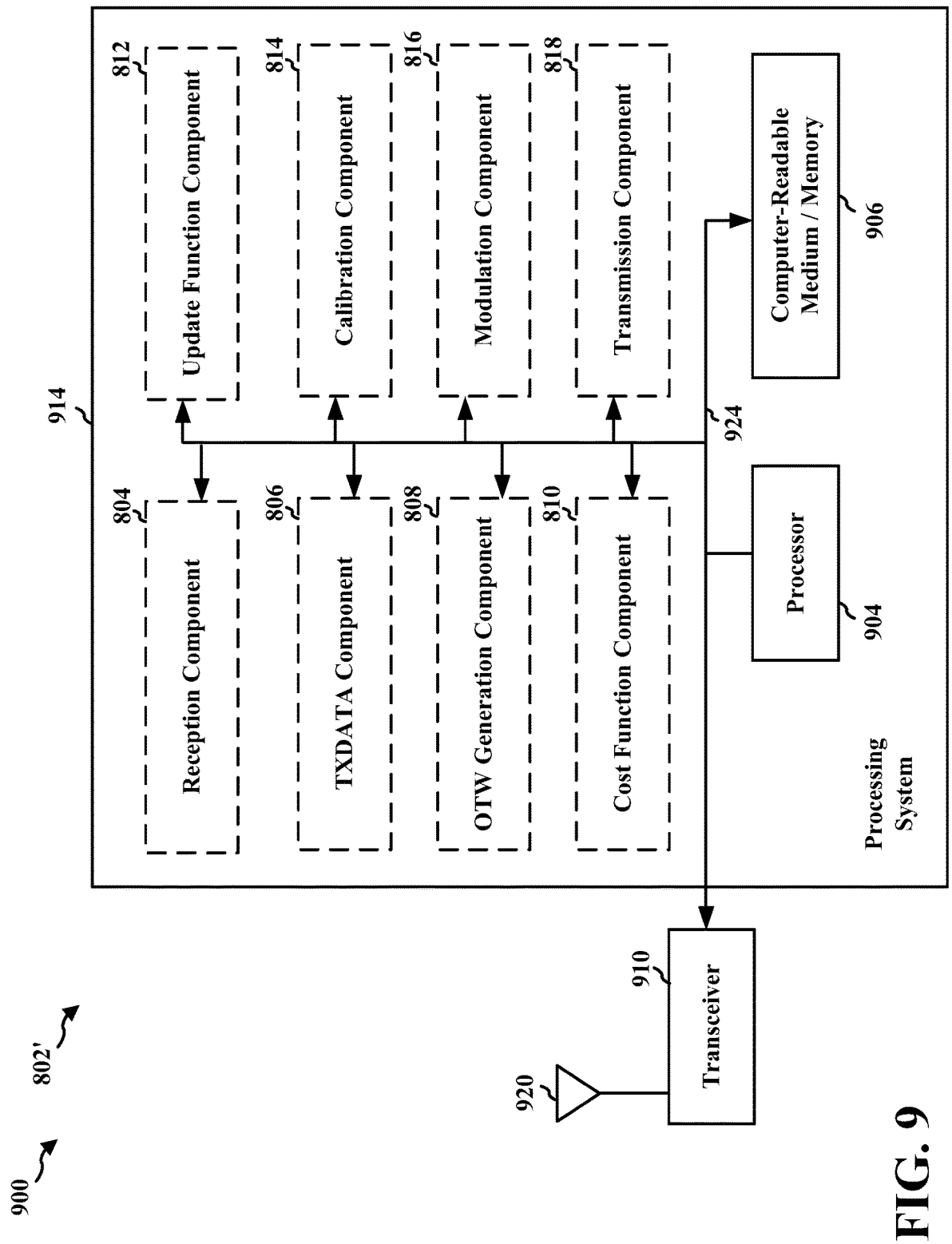
FIG. 9 is a diagram illustrating an example of a hardware implementation for an apparatus employing a processing system.

FIG. 9 is a diagram 900 illustrating an example of a hardware implementation for an apparatus 802' employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, 810, 812, 814, 816, 818, 820, and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 is coupled to one or more antennas 920. The transceiver 910 provides a means for communicating with various other apparatus over a transmission medium. The transceiver 910 receives a signal from the one or more antennas 920, extracts information from the received signal, and provides the extracted information to the processing system 914, specifically the reception component 804. In addition, the transceiver 910 receives information from the processing system 914, specifically the transmission component 818, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808, 810, 812, 814, 816, 818, 820. The components may be software components running in the processor 904, resident/stored in the computer readable medium/memory 906, one or more hardware components coupled to the processor 904, or some combination thereof.

In certain configurations, the apparatus 802/802' for wireless communication may include means for receiving an otw signal that is associated with low-path pass information and transmission data. In certain other configurations, the apparatus 802/802' for wireless communication may include means for applying a cost function and means for applying an update function to the otw signal prior to sending the otw signal to an oscillator. In certain aspects, the means for include means for applying the cost function to the otw signal may be configured to remove a DC portion of the otw signal to obtain an AC portion of the otw signal. In certain aspects, the means for include means for applying the cost function to the otw signal may be configured to determine a PAR associated with the AC portion of the otw signal and an anti-PAR ratio associated with the AC portion of the otw signal. In certain aspects, the means for include means for applying the cost function to the otw signal may be configured to select a metric for use by the update function based at least in part on the PAR ratio and the anti-PAR ratio of the otw signal. In certain aspects, the means for applying the cost function to the otw signal may be configured to determine a peak value associated with the otw signal or an anti-peak value associated with the otw signal. In certain other aspects, the means for applying the update function to the otw signal may be configured to remove a bias from the PAR. In certain other aspects, the means for applying the update function to the otw signal may be configured to apply a gain factor to the PAR upon removing the bias. In certain other aspects, the means for applying the update function to the otw signal may be configured to integrate at least a portion of the PAR upon applying the gain factor. In certain other aspects, the means for applying the update function to the otw signal may be configured to apply the bias to the PAR to obtain the output of the PAR. In certain other configurations, the apparatus 802/802' for wireless communication may include means for determining a correction factor for use in estimating a gain of the oscillator based at least in part on the applying of the cost function and the update function to the otw signal. In certain other configurations, the apparatus 802/802' for wireless communication may include means for determining a calibrated oscillator gain based at least in part on the correction factor. In certain other configurations, the apparatus 802/802' for wireless communication may include means for modulating, using the oscillator, the data transmission based at least in part on the calibrated oscillator gain. In certain other configurations, the apparatus 802/802' for wireless communication may include means for transmitting the modulated data transmission to a second wireless device. The aforementioned means may be the communication device 112, 122, the RAT transceiver 140, 150, the ADPLL 142, 152, 200, 400, 600, the communication controller 114, 124, the processing system 116, 126, the memory component 118, 128, the cost function 410, the update function 420, the high-pass gain 208, the high-pass gain 430, one or more of the aforementioned components of the apparatus 802 and/or the processing system 914 of the apparatus 802' configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a first wireless device that includes an all-digital phase lock loop (ADPLL), comprising:
   receiving an oscillator tuning word (otw) signal that is associated with low-path pass information and transmission data;
   applying a cost function and an update function to the otw signal prior to sending the otw signal to an oscillator; and
   determining a correction factor for use in estimating a gain of the oscillator based at least in part on an output of the update function,
   wherein the applying the cost function to the otw signal comprises:
      removing a direct current (DC) portion of the otw signal to obtain an analog-current (AC) portion of the otw signal;
      determining a peak-to-average ratio (PAR) associated with the AC portion of the otw signal and an anti-PAR ratio associated with the AC portion of the otw signal;
      selecting a metric for use by the update function based at least in part on the PAR ratio and the anti-PAR ratio of the otw signal;
      determining a peak value associated with the otw signal or an anti-peak value associated with the otw signal; and
      sending one or more of the metric, the PAR, the anti-PAR, the peak value, or the anti-peak value associated with the otw signal to the update function.

2. The method of claim 1, wherein the applying the update function to the otw signal comprises:
   removing a bias from the PAR;
   applying a gain factor to the PAR upon removing the bias;
   integrating at least a portion of the PAR upon applying the gain factor; and
   applying the bias to the PAR to obtain the output of the PAR.

3. An apparatus for wireless communication of a first wireless device that includes an all-digital phase lock loop (ADPLL), comprising:
   means for receiving an oscillator tuning word (otw) signal that is associated with low-path pass information and transmission data;
   means for applying a cost function and an update function to the otw signal prior to sending the otw signal to an oscillator; and
   means for determining a correction factor for use in estimating a gain of the oscillator based at least in part on an output of the update function;
   wherein the means for applying the cost function to the otw signal is configured to:
      remove a direct current (DC) portion of the otw signal to obtain an analog-current (AC) portion of the otw signal;
      determine a peak-to-average ratio (PAR) associated with the AC portion of the otw signal and an anti-PAR ratio associated with the AC portion of the otw signal;
      select a metric for use by the update function based at least in part on the PAR ratio and the anti-PAR ratio of the otw signal;
      determine a peak value associated with the otw signal or an anti-peak value associated with the otw signal; and
      send one or more of the metric, the PAR, the anti-PAR, the peak value, or the anti-peak value associated with the otw signal to the update function.

4. The apparatus of claim 3, wherein the means for applying the update function to the otw signal is configured to:
   remove a bias from the PAR;
   apply a gain factor to the PAR upon removing the bias;
   integrate at least a portion of the PAR upon applying the gain factor; and
   apply the bias to the PAR to obtain the output of the PAR.

5. The apparatus of claim 4, further comprising:
   means for determining a calibrated oscillator gain based at least in part on the correction factor; and
   means for modulating, using the oscillator, the data transmission based at least in part on the calibrated oscillator gain; and
   means for transmitting the modulated data transmission to a second wireless device.

6. An apparatus for wireless communication of a first wireless device that includes an all-digital phase lock loop (ADPLL), comprising:
   receive an oscillator tuning word (otw) signal that is associated with low-path pass information and transmission data;
   apply a cost function and an update function to the otw signal prior to sending the otw signal to an oscillator; and
   determine a correction factor for use in estimating a gain of the oscillator based at least in part on an output of the update function,
   wherein the at least one processor is configured to apply the cost function to the otw signal by:
      removing a direct current (DC) portion of the otw signal to obtain an analog-current (AC) portion of the otw signal;
      determining a peak-to-average ratio (PAR) associated with the AC portion of the otw signal and an anti-PAR ratio associated with the AC portion of the otw signal;
      selecting a metric for use by the update function based at least in part on the PAR ratio and the anti-PAR ratio of the otw signal;
      determining a peak value associated with the otw signal or an anti-peak value associated with the otw signal; and sending one or more of the metric, the PAR, the anti-PAR, the peak value, or the anti-peak value associated with the otw signal to the update function.

7. The apparatus of claim 6, wherein the at least one processor is configured to apply the update function to the otw signal by:
  removing a bias from the PAR;
  applying a gain factor to the PAR upon removing the bias;
  integrating at least a portion of the PAR upon applying the gain factor; and
  applying the bias to the PAR to obtain the output of the PAR.

8. A non-transitory computer-readable medium storing computer executable code of a first wireless device that includes an all-digital phase lock loop (ADPLL), comprising code to:
  receive an oscillator tuning word (otw) signal that is associated with low-path pass information and transmission data;
  apply a cost function and an update function to the otw signal prior to sending the otw signal to an oscillator; and
  determine a correction factor for use in estimating a gain of the oscillator based at least in part on an output of the update function,
  wherein the code to apply the cost function to the otw signal is configured to:
    remove a direct current (DC) portion of the otw signal to obtain an analog-current (AC) portion of the otw signal;
    determine a peak-to-average ratio (PAR) associated with the AC portion of the otw signal and an anti-PAR ratio associated with the AC portion of the otw signal;
    select a metric for use by the update function based at least in part on the PAR ratio and the anti-PAR ratio of the otw signal;
    determine a peak value associated with the otw signal or an anti-peak value associated with the otw signal; and
    send one or more of the metric, the PAR, the anti-PAR, the peak value, or the anti-peak value associated with the otw signal to the update function.

9. The non-transitory computer-readable medium of claim 8, wherein the code to apply the update function to the otw signal is configured to:
  remove a bias from the PAR;
  apply a gain factor to the PAR upon removing the bias;
  integrate at least a portion of the PAR upon applying the gain factor; and
  apply the bias to the PAR to obtain the output of the PAR.

* * * * *